(12) United States Patent
Mehdizad Taleie et al.

(10) Patent No.: US 10,663,572 B2
(45) Date of Patent: May 26, 2020

(54) PROGRAMMABLE MULTI-MODE DIGITAL-TO-ANALOG CONVERTER (DAC) FOR WIDEBAND APPLICATIONS

(71) Applicant: QUALCOMM Incorporated, San Diego, CA (US)

(72) Inventors: Shahin Mehdizad Taleie, San Diego, CA (US); Chen Jiang, Davis, CA (US); Dongwon Seo, San Diego, CA (US); Udara Fernando, San Diego, CA (US); Shrenik Patel, San Diego, CA (US); Roberto Rimini, San Diego, CA (US); Anant Gupta, Santa Barbara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/012,193

(22) Filed: Jun. 19, 2018

(65) Prior Publication Data

US 2019/0383924 A1 Dec. 19, 2019

(51) Int. Cl.
| | | |
|---|---|---|
| *H04B 1/40* | (2015.01) | |
| *G01S 13/34* | (2006.01) | |
| *G01S 13/02* | (2006.01) | |
| *H04L 27/36* | (2006.01) | |
| *H03M 1/66* | (2006.01) | |
| *H04L 27/38* | (2006.01) | |

(52) U.S. Cl.
CPC .......... *G01S 13/34* (2013.01); *G01S 13/0209* (2013.01); *H03M 1/662* (2013.01); *H04B 1/40* (2013.01); *H04L 27/364* (2013.01); *H04L 27/367* (2013.01); *H04L 27/3809* (2013.01)

(58) Field of Classification Search
CPC ........ H04B 1/40; H04B 1/0007; H04L 27/364

USPC ........ 375/293–297, 300, 306, 354–355, 316, 375/319

See application file for complete search history.

(56) References Cited

U.S. PATENT DOCUMENTS

| | | | | |
|---|---|---|---|---|
| 4,728,906 A | * | 3/1988 | Turl ........................... | H03L 7/20 331/10 |
| 6,041,080 A | * | 3/2000 | Fraisse ................... | H04H 60/04 341/110 |
| 6,301,366 B1 | * | 10/2001 | Malcolm, Jr. ........... | G06F 3/162 381/119 |
| 6,320,528 B1 | * | 11/2001 | Michel .................. | H03M 1/109 341/120 |

(Continued)

OTHER PUBLICATIONS

Luo Y., et al., "A Modulation Depth and Output Power Tunable 5.8-GHz CMOS Direct-Conversion Transmitter," 13th IEEE International Conference on Solid-State and Integrated Circuit Technology (ICSICT), 2016, 3 Pages.

*Primary Examiner* — Emmanuel Bayard
(74) *Attorney, Agent, or Firm* — Patterson + Sheridan, L.L.P.

(57) ABSTRACT

Certain aspects of the present disclosure generally relate to a programmable multi-mode digital-to-analog converter (DAC) for generating a frequency-modulated signal. For example, certain aspects provide a circuit for sweeping a frequency of an output signal. The circuit generally includes a DAC having an input coupled to an input path of the circuit and an output coupled to an output path of the circuit, a first mixer selectively incorporated in the input path coupled to the input of the DAC, and a second mixer selectively incorporated in the output path coupled to the output of the DAC.

30 Claims, 11 Drawing Sheets

(56) References Cited

U.S. PATENT DOCUMENTS

| | | | |
|---|---|---|---|
| 6,690,313 B1* | 2/2004 | Warren | H03M 1/687 |
| | | | 341/141 |
| 7,528,754 B1* | 5/2009 | Bakkaloglu | H03M 3/504 |
| | | | 341/136 |
| 8,416,121 B2 | 4/2013 | Chen et al. | |
| 8,686,736 B2 | 4/2014 | Forstner | |
| 9,184,773 B2 | 11/2015 | Nadiri et al. | |
| 9,413,383 B1* | 8/2016 | Sharma | H03M 3/384 |
| 9,444,405 B1* | 9/2016 | Dao | H03F 1/0205 |
| 9,473,071 B2 | 10/2016 | Trotta et al. | |
| 2002/0047793 A1* | 4/2002 | Eriksson | H03M 1/0626 |
| | | | 341/144 |
| 2008/0042889 A1* | 2/2008 | Cho | H03M 1/1225 |
| | | | 341/161 |
| 2011/0128174 A1* | 6/2011 | Lee | H03M 1/76 |
| | | | 341/144 |
| 2011/0275341 A1* | 11/2011 | Landmark | H04B 1/109 |
| | | | 455/318 |
| 2014/0015604 A1* | 1/2014 | Eschlboeck | H03F 1/0277 |
| | | | 330/131 |
| 2014/0159933 A1* | 6/2014 | Dufrene | H03M 1/66 |
| | | | 341/144 |
| 2014/0364132 A1* | 12/2014 | Rey | H04L 27/12 |
| | | | 455/450 |
| 2015/0103872 A1* | 4/2015 | Tarighat Mehrabani | |
| | | | H04L 27/00 |
| | | | 375/219 |
| 2016/0078837 A1* | 3/2016 | Hong | G09G 3/3696 |
| | | | 345/690 |
| 2016/0242645 A1* | 8/2016 | Muller | A61B 5/7203 |
| 2016/0329631 A1* | 11/2016 | Rheinfelder | H01Q 1/246 |

* cited by examiner $fout = fs - fb$

PROGRAMMABLE MULTI-MODE DIGITAL-TO-ANALOG CONVERTER (DAC) FOR WIDEBAND APPLICATIONS

TECHNICAL FIELD

Certain aspects of the present disclosure generally relate to electronic circuits and, more particularly, to circuitry for generating a frequency-modulated signal.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more digital-to-analog converters (DACs) for converting digital signals to analog signals.

In some cases, at least one of the DACs may be used to generate a frequency-modulated signal to perform radar operations. For example, the radar operations may be used to detect the presence of a human body in close proximity to a mobile station, based on which a power of signals transmitted by the mobile station may be reduced to comply with regulatory requirements.

SUMMARY

Certain aspects of the present disclosure generally relate to a programmable mixed-mode digital-to-analog converter (DAC) for generating a frequency-modulated signal.

Certain aspects provide a circuit for sweeping a frequency of an output signal. The circuit generally includes a DAC having an input coupled to an input path of the circuit and an output coupled to an output path of the circuit, a first mixer selectively incorporated in the input path coupled to the input of the DAC, and a second mixer selectively incorporated in the output path coupled to the output of the DAC.

Certain aspects provide a method for sweeping a frequency of an output signal. The method generally includes sweeping a frequency of a digital input signal from a first frequency to a second frequency during a first time interval, the second frequency being greater than the first frequency, frequency mixing the digital input signal to generate a digital mixed signal during the first time interval, performing digital-to-analog conversion of the digital mixed signal to generate an analog signal during the first time interval, and frequency mixing the analog signal to generate the output signal during the first time interval.

Certain aspects provide an apparatus for sweeping a frequency of an output signal. The apparatus generally includes means for sweeping a frequency of a digital input signal from a first frequency to a second frequency, the second frequency being greater than the first frequency, means for selectively frequency mixing the digital input signal to generate a digital mixed signal, means for converting the digital mixed signal to an analog signal, and means for selectively frequency mixing the analog signal to generate the output signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
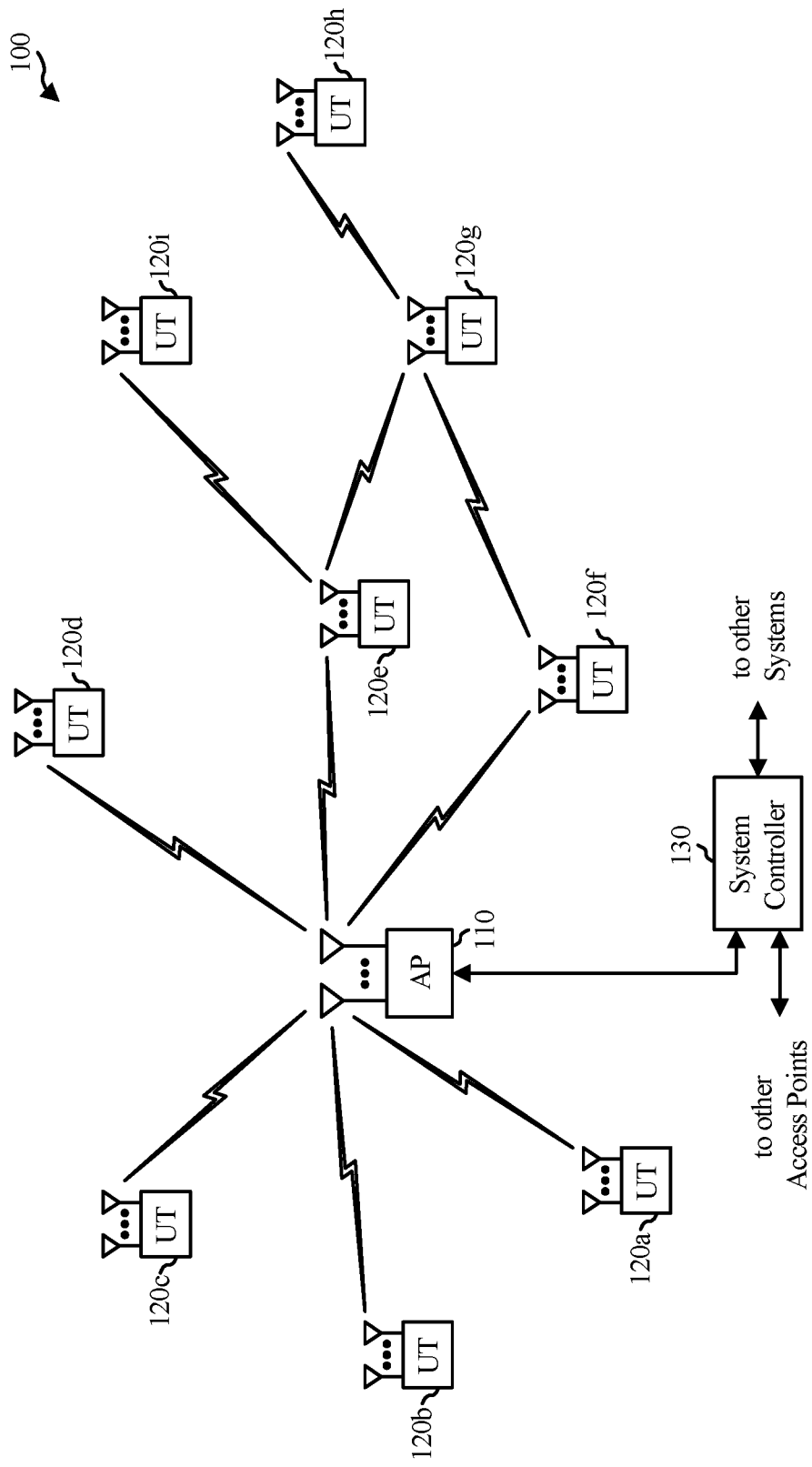
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission.

Each user terminal 120 may be equipped with a single antenna (e.g., to keep costs down) or multiple antennas (e.g., where the additional cost can be supported). In certain aspects of the present disclosure, the access point 110 and/or user terminal 120 may include at least one multi-mode digital-to-analog converter (DAC) system for generating a frequency-modulated signal, as described in more detail herein.

Figure 2:
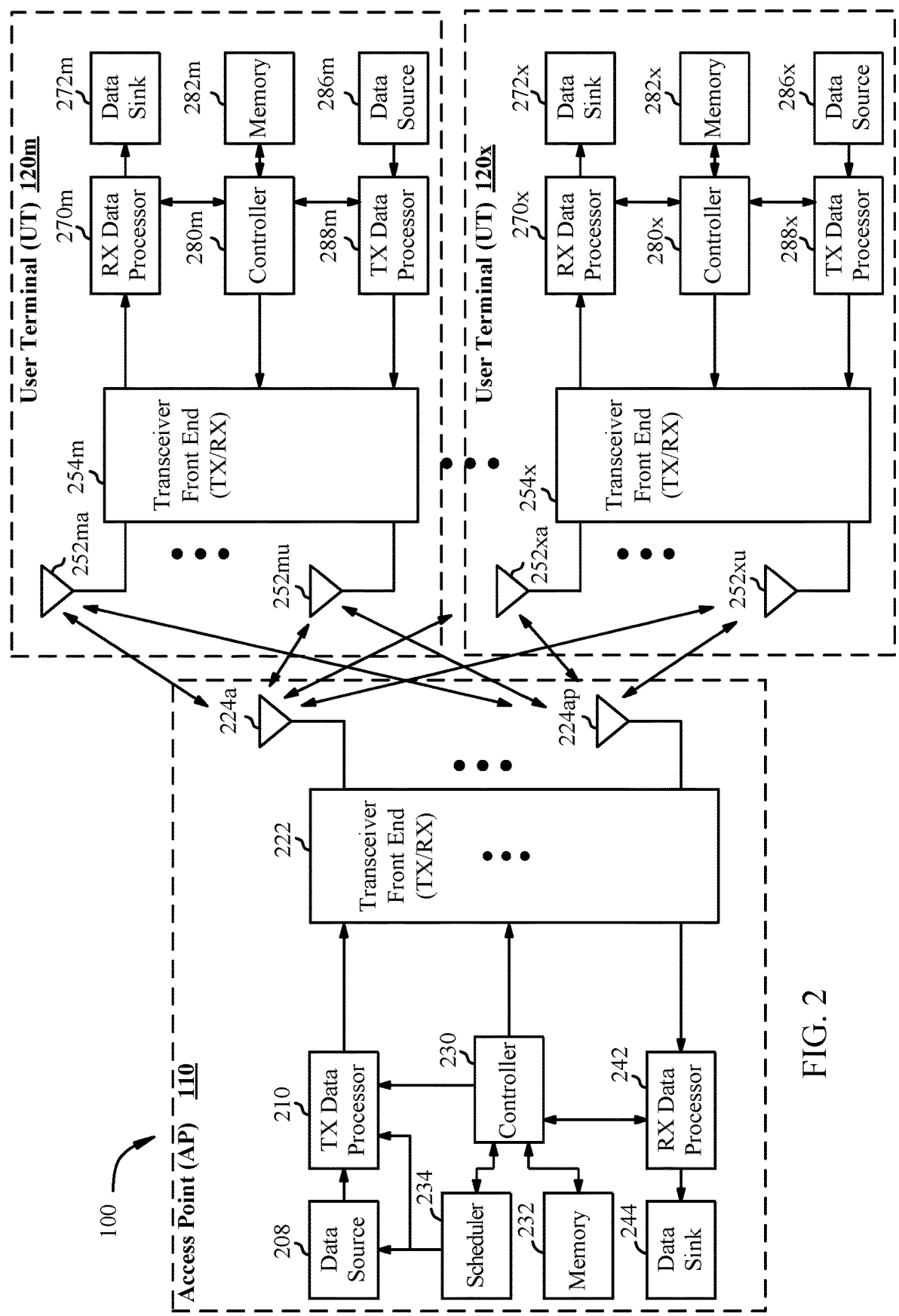
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include at least one multi-mode DAC system for generating a frequency-modulated signal, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
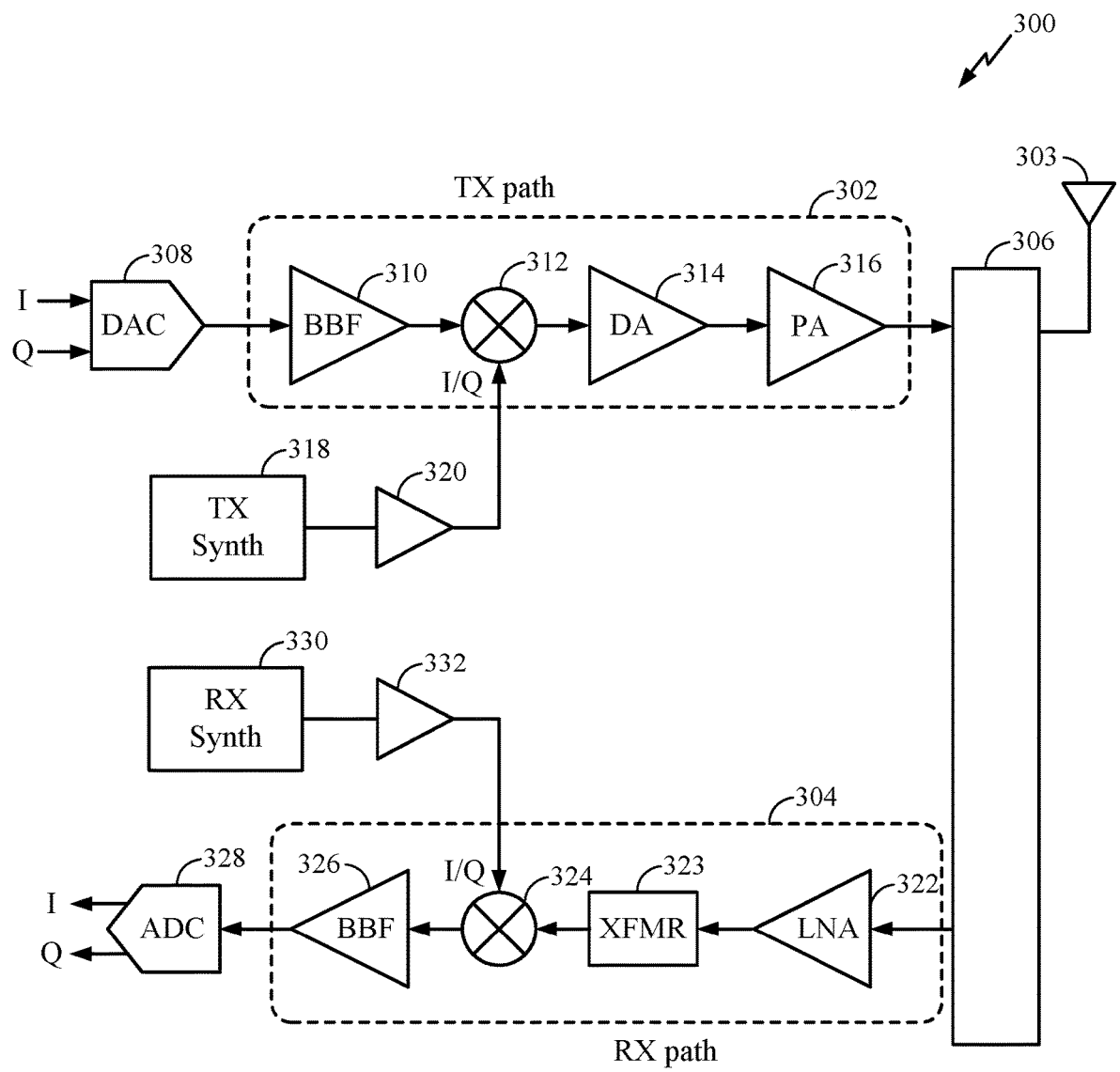
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The DAC 308 may be part of a multi-mode DAC system used to generate a frequency-modulated signal, as described in more detail herein. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied to generate frequency-modulated signals in any of various other suitable systems (e.g., frequency-modulated continuous wave (FMCW) radar).

Example Programmable Multi-Mode Digital-to-Analog Converter (DAC)

Fifth generation of wireless systems (5G)/millimeter wave (mmWave) transmission may occur, for example, at 28 GHz or 39 GHz at a power set to achieve a desired throughput at the edge of a cell. A system may transmit a packet of data with a certain desired equivalent isotropically radiated power (EIRP) so that the packet reaches a base station with an acceptable signal-to-noise ratio (SNR). However, if there is a human body within a certain distance of the transmitter, transmitting at the desired EIRP may violate regulations of the Federal Communications Commission (FCC) or other communications governing entity, and thus, the transmission power may be reduced. Therefore, radar may be used to determine whether a human is within close proximity (e.g., within 14 cm) to the transmitter such that a reduction in transmission power is warranted.

To detect the presence of a human in close proximity, a frequency-modulated continuous wave (FMCW) radar may be used. FMCW radar is implemented by generating a continuous-wave signal transmission, which reflects off of objects (e.g., a human). The reflection is received to detect the object in close proximity to the transmitter. By modulating the frequency of the continuous-wave, a distance and speed of an object may also be detected.

The frequency of an analog signal generated by a DAC may have an upper threshold set to the Nyquist frequency (e.g., half the sampling frequency (fs) of the DAC). However, in order to provide adequate signal image attenuation with a practical low-order filter, the upper threshold of the frequency of the analog signal may be set to about a quarter of the sampling frequency (fs/4). If a wider bandwidth than fs/4 is to be implemented, fs may be increased, and the digital signal bandwidth feeding data to the DAC may be increased, which may result in increased complexity of the clock generation and the design of the DAC and may also increase power consumption. For example, with a DAC having a sampling frequency of 2 GHz, the Nyquist frequency is 1 GHz, and a quarter of the sampling frequency is 500 MHz. In order to generate an analog output signal at frequencies above 500 MHz, the sampling frequency of the DAC may have to be increased to 8 GHz, which may not be practical for mobile applications using complementary metal-oxide-semiconductor (CMOS) technology, for example.

Certain aspects of the present disclosure are generally directed to a multi-mode DAC system (e.g., which may also be referred to as a mixed-mode DAC system) of a transmit path providing an output signal frequency swept from 0 Hz to the sampling frequency of the DAC, in spite of the Nyquist theory. Such a multi-mode DAC system may be used to generate a frequency-modulated signal for use with FMCW radar and any of various other suitable applications.

Figure 4:
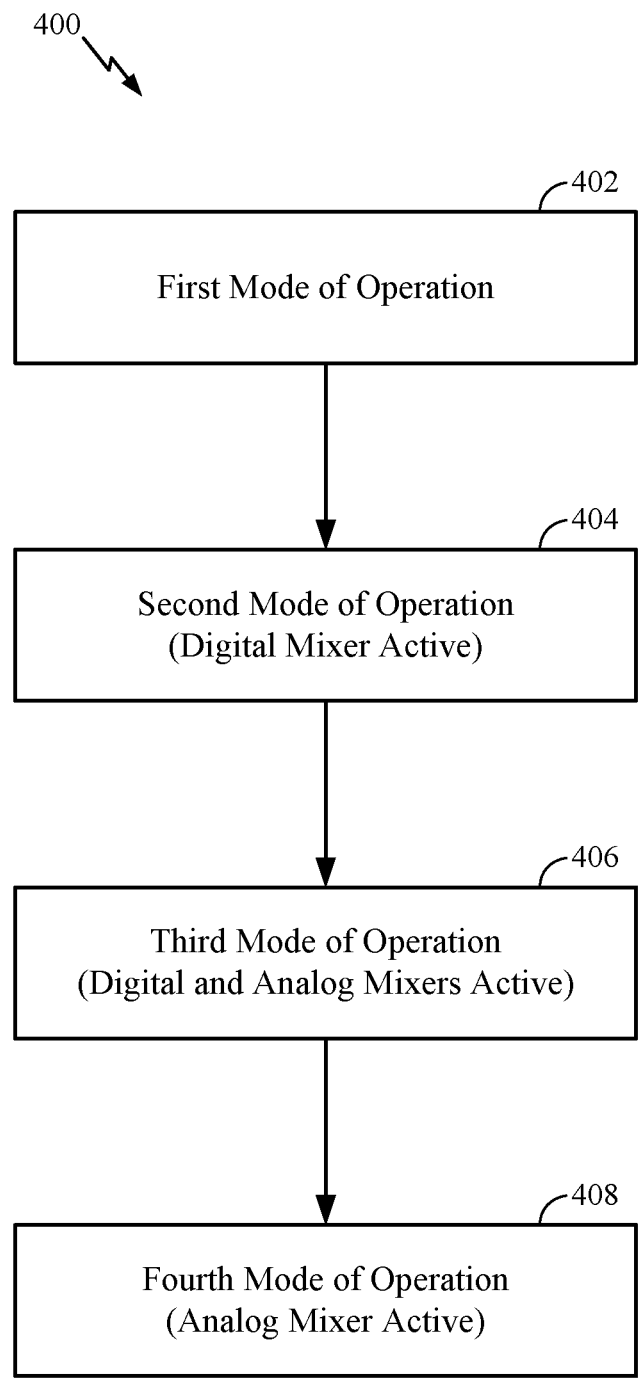
FIG. 4 is a flow diagram illustrating different modes of operation of a programmable multi-mode DAC system to generate a frequency-modulated signal, in accordance with certain aspects of the present disclosure.

FIG. 4 is a flow diagram 400 illustrating different modes of operation of a programmable multi-mode DAC system to generate a frequency-modulated signal, in accordance with certain aspects of the present disclosure. A combination of digital, analog, and mixed-mode mixing may be used to expand the bandwidth of the DAC. As used herein, "mixed-mode mixing" generally refers to performing both digital and analog mixing. For example, the DAC system may be operated in four different modes of operation, each mode sweeping an output signal across a different portion of a bandwidth. For instance, the multi-mode DAC system may be operated in a first mode of operation at block 402 where a digital input signal may be converted to an analog signal using a DAC, as described in more detail with respect to FIG. 5. During the first mode of operation, the DAC system may generate an output signal having a frequency that sweeps from 0 Hz to a quarter of the sampling frequency (fs/4) of the DAC.

Subsequently, the multi-mode DAC system may be transitioned to a second mode of operation at block 404 by activating a digital mixer at the input of the DAC, as described in more detail with respect to FIG. 6. During the second mode of operation, the DAC may generate an output signal having a frequency that sweeps from a quarter to half the sampling frequency (fs/2) of the DAC.

Subsequently, the multi-mode DAC system may be transitioned to a third mode of operation at block 406 by activating an analog mixer at the output of the DAC while the digital mixer at the input of the DAC remains active, as described in more detail with respect to FIG. 7. During the third mode of operation, the DAC system may generate an output signal having a frequency that sweeps from half the sampling frequency to three/fourths the sampling frequency (3 fs/4) of the DAC.

Subsequently, the multi-mode DAC system may be transitioned to a fourth mode of operation at block 408 by deactivating the digital mixer at the input of the DAC, while the analog mixer remains active, as described in more detail with respect to FIG. 8. During the fourth mode of operation, the DAC system may generate an output signal having a frequency that sweeps from three/fourths the sampling frequency to the sampling frequency of the DAC. For certain aspects, the multi-mode DAC system may subsequently be transitioned back to the first mode of operation at block 402.

In certain aspects, a soft, phase-continuous hand-off between the modes of operation may occur at the falling edge of a clock controlling sampling of the DAC at fs, as described in more detail herein. Mode switching may be performed via digital controls inside the DAC system that control combinational logic and the DAC switch driver mode selection. For example, the combinational logic and switches may be controlled via digital control signals to activate/deactivate (e.g., bypass) mixers to transition between the modes of operation as described with respect to FIG. 4. As described in more detail herein, certain aspects of the present disclosure allow the frequency of an incoming digital signal to stay within the DAC bandwidth.

Figure 5:
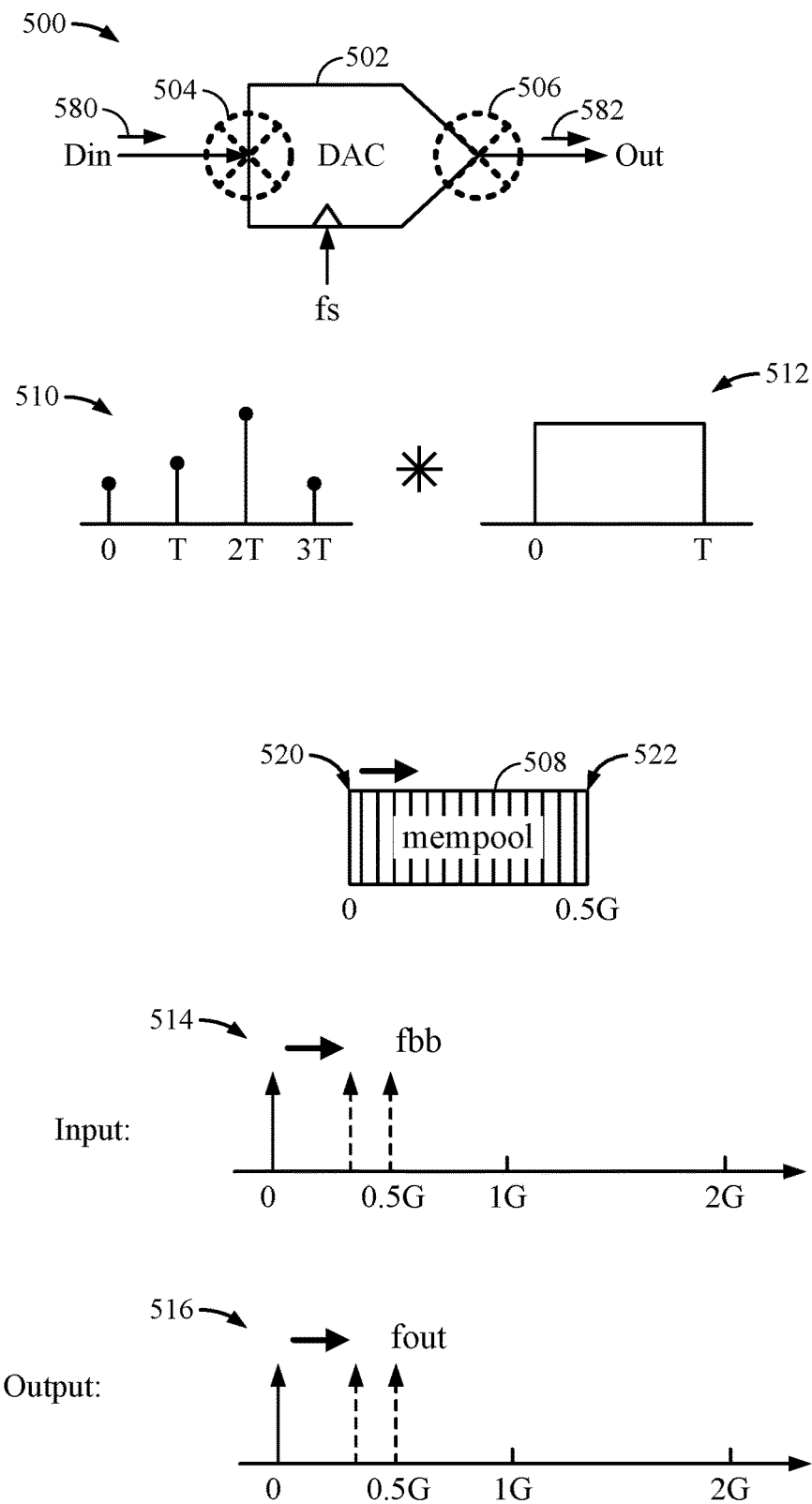
FIG. 5 illustrates the first mode of operation of the programmable multi-mode DAC system, in accordance with certain aspects of the present disclosure.

FIG. 5 illustrates the first mode of operation of the programmable multi-mode DAC system 500, in accordance with certain aspects of the present disclosure. The multi-mode DAC system 500 includes a DAC 502 (e.g., corresponding to the DAC 308 of FIG. 3), a mixer 504 which may be selectively incorporated (e.g., by bypassing or disabling the mixer 504) in the input path 580 of the DAC 502, and a mixer 506 which may be selectively incorporated (e.g., by bypassing or disabling the mixer 506) in the output path 582 of the DAC 502. For example, the mixer 504 and the mixer 506 may be bypassed or disabled in the first mode of operation of the multi-mode DAC system 500. For instance, the mixer 504 can perform frequency mixing by multiplying a digital input signal with a repeating sequence of +1 and −1, which may be performed, for example, by switching the polarity of a two's complement number every clock cycle. In order to disable the mixer 504, the digital input signal may be multiplied by +1, instead of the repeating sequence of +1 and −1 by, for example, deactivating the most significant bit (MSB) change of the two's complement number. The mixer 506 may perform frequency mixing by swapping the polarity of an input signal (e.g., the output of the digital DAC 502) at the falling edge of every other clock cycle. In this case, the mixer 506 may be disabled by disabling the swapping of the polarity.

In the first mode of operation, a digital input (Din) may be received by the DAC 502 for conversion to an analog output signal (Out), where the DAC is clocked at a certain sampling frequency (fs) (e.g., 2 GHz). The digital input may be generated from a memory pool 508 (labeled "mempool"). The digital data stored in the memory pool 508 is read and provided to the input of the DAC 502 starting from a first memory location 520 to a second memory location 522. For example, a processing system (e.g., which may include the controller 230 or 280 as described with respect to FIG. 2) may read the memory pool 508. For certain aspects, the memory pool 508 may correspond to a portion of the memory 232 or 282 as described with respect to FIG. 2. For certain aspects, the first memory location 520 may be the initial location (e.g., with the lowest memory address) in the memory pool 508, while the second memory location 522 may be the last memory location (e.g., with the highest memory address) in the memory pool. The digital values in the memory pool 508 may be set such that the digital input represents signal having a frequency (e.g., the baseband frequency (fbb)) that sweeps from 0 Hz to a quarter of the sampling frequency of the DAC (e.g., fs/4=0.5 GHz), as shown by graph 514. Since the mixers 504 and 506 are bypassed, the frequency of the analog output signal (fout) may be equal to the frequency of the signal represented by the digital input (e.g., the baseband frequency fbb). Thus, the frequency of the analog output also sweeps from 0 Hz to 0.5 GHz, as shown by graph 516. The graph 510 is a discrete time representation of the digital input illustrating a sample at every sampling interval T (=1/fs), and graph 512 illustrates the impulse response of the DAC 502 convolved with the discrete samples to convert the digital input to an analog signal. Thus, the first mode of operation represents typical operation for a DAC by itself, without the mixers 504, 506.

Figure 6:
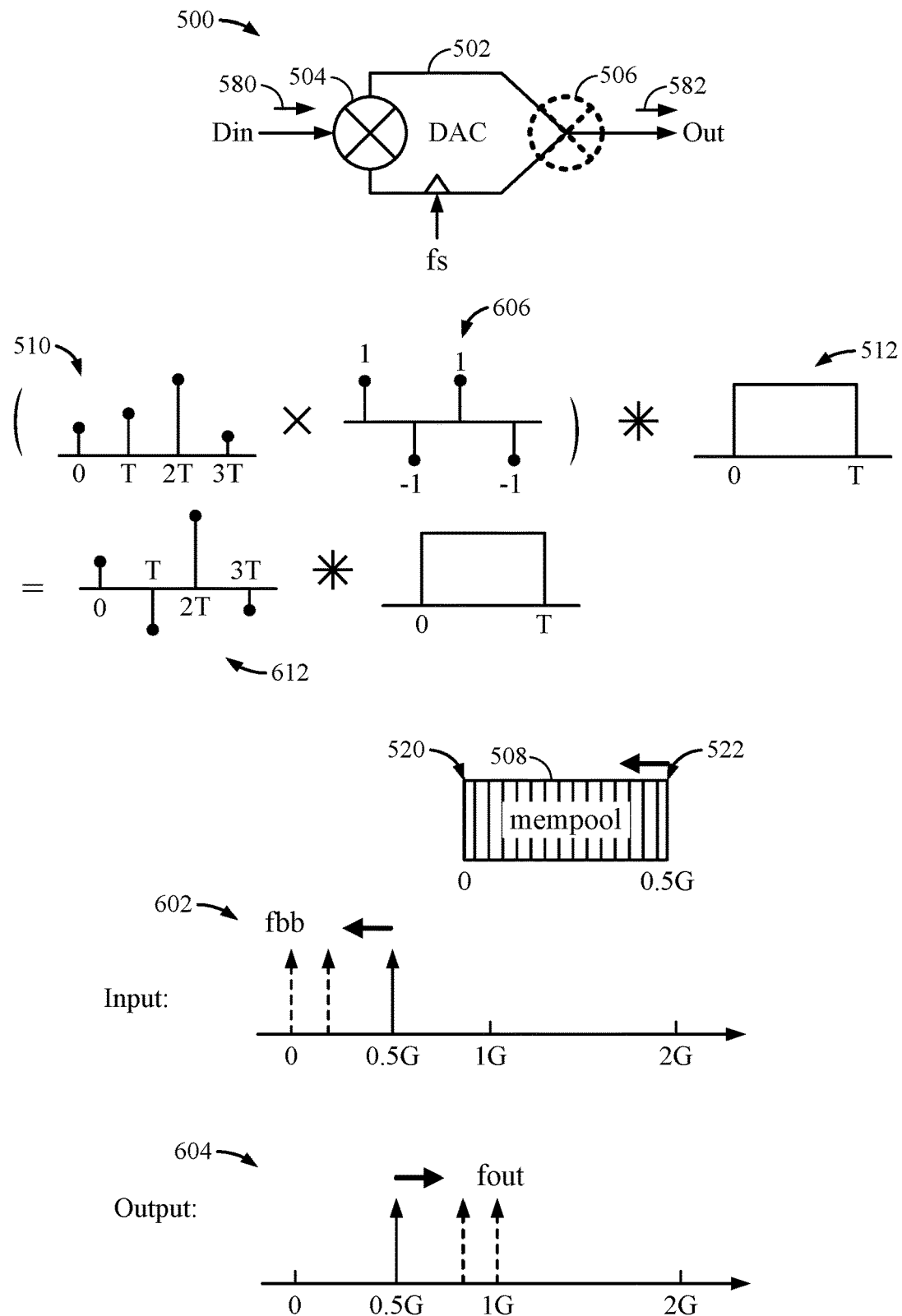
FIG. 6 illustrates the second mode of operation of the programmable multi-mode DAC system, in accordance with certain aspects of the present disclosure.

FIG. 6 illustrates the second mode of operation of the programmable multi-mode DAC system 500, in accordance with certain aspects of the present disclosure. In the second mode of operation, the mixer 504 coupled to the input of the DAC 502 is activated, and the mixer 506 is deactivated (e.g., bypassed). In this case, the data stored in the memory pool 508 is read and provided to the input of the mixer 504 starting from the second memory location 522 to the first memory location 520 such that the digital input represents a frequency sweep of fbb from fs/4 down to 0 (e.g., 0.5 GHz to 0 Hz) as illustrated in graph 602.

By activating the mixer 504, the digital input (Din) may effectively be multiplied by a discrete time function, as shown by graph 606, inverting every other digital value in the time domain to generate a discrete time signal as illustrated by graph 612. The discrete time signal generated at the output of the mixer 504 is provided to DAC 502 and converted to an analog signal. In this manner, the frequency of the analog output signal (fout) may be represented by the following equation:

$$fout = \frac{fs}{2} - fbb$$

where fs is the sampling frequency of the DAC 502, and fbb is the baseband frequency (e.g., the frequency represented by the digital input (Din)). Thus, with a sampling frequency (fs) of 2 GHz, the frequency of the analog output signal (fout) sweeps from 0.5 GHz (fs/4) to 1 GHz (fs/2) due to the upconversion by the activated mixer 504, as illustrated by graph 604. The frequency of the digital input is swept from a higher frequency (e.g., 0.5 GHz) to a lower frequency (e.g., 0 Hz), but the analog output signal generated by the multi-mode DAC system 500 is swept in the opposite direction from the lower frequency to the higher frequency, which is due to the frequency mixing of the digital input performed by the mixer 504.

Figure 7:
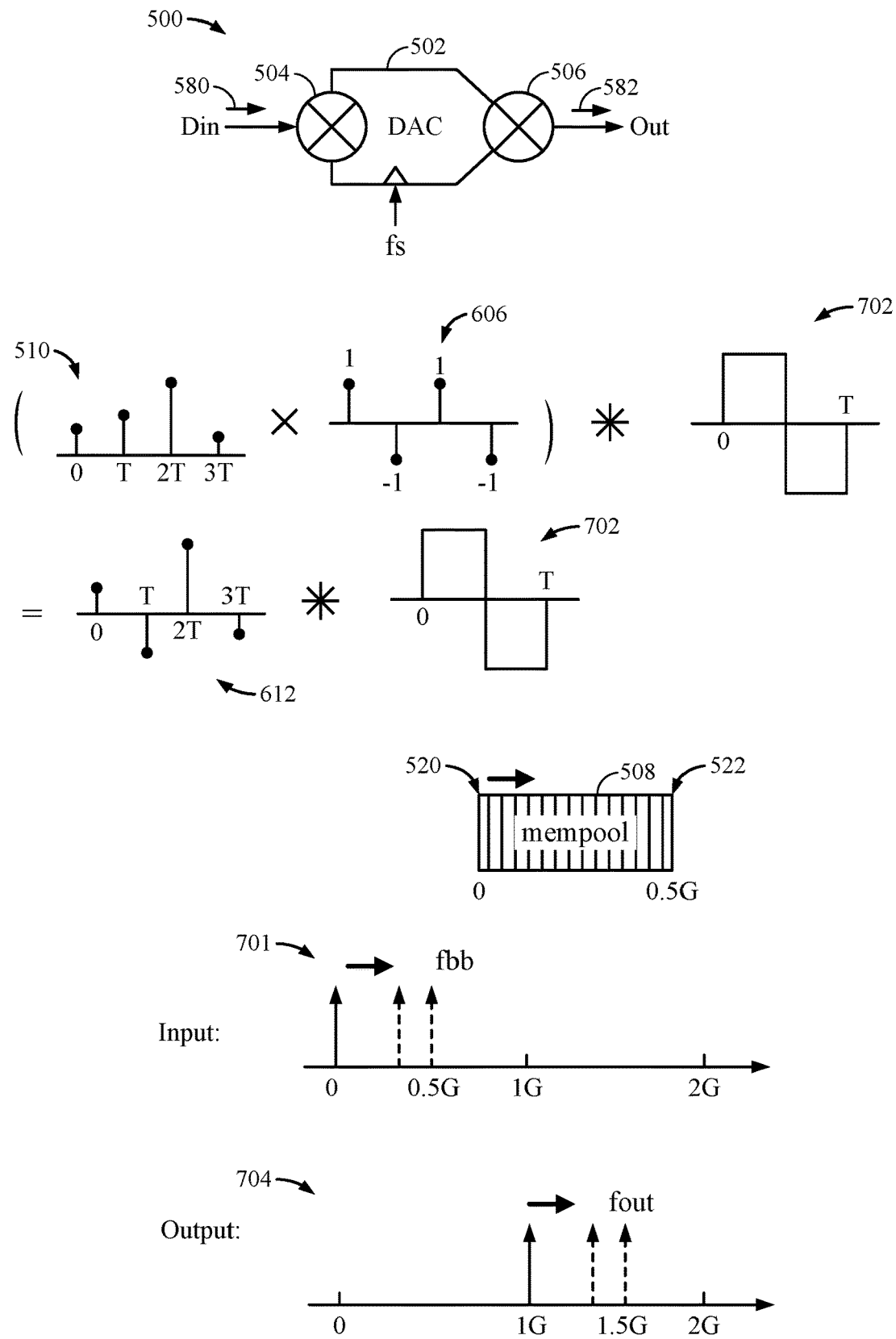
FIG. 7 illustrates the third mode of operation of the programmable multi-mode DAC system, in accordance with certain aspects of the present disclosure.

FIG. 7 illustrates the third mode of operation of the programmable multi-mode DAC system 500, in accordance with certain aspects of the present disclosure. In the third mode of operation, the mixer 504 coupled to the input of the DAC 502 is activated (or remains activated), and the mixer 506 coupled to the output of the DAC 502 is also activated. In this case, the data stored in the memory pool 508 is read and provided to the input of the mixer 504 starting from the first memory location 520 to the second memory location 522 such that the digital input represents a frequency sweep from 0 to fs/4 (e.g., 0 Hz to 0.5 GHz) as illustrated in graph 701.

By activating the mixer 506, the analog output signal is generated at the output of the mixer 506. Graph 702 illustrates the combined impulse response of the DAC 502 and the mixer 506. The combined impulse response is similar to the impulse response of the DAC 502 (as illustrated in graph 512), but includes a polarity shift. In this manner, the frequency of the analog output signal (fout) may be represented by the following equation:

$$fout = fs - \left(\frac{fs}{2} - fbb\right) = \frac{fs}{2} + fbb$$

Thus, with a sampling frequency (fs) of 2 GHz, the frequency of the analog output signal (fout) sweeps from 1 GHz (fs/2) to 1.5 GHz (3 fs/4), as illustrated by graph 704. Thus, the frequency capability of the multi-mode DAC system 500 in generating the analog output signal has already surpassed the Nyquist frequency for the DAC 502 alone, in the third mode of operation.

Figure 8:
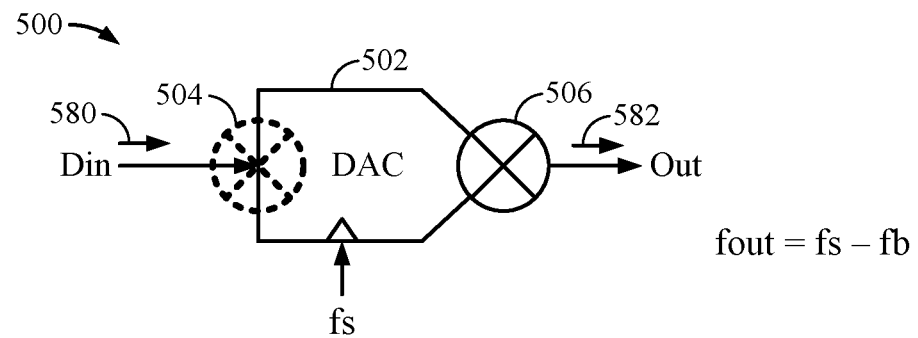
FIG. 8 illustrates the fourth mode of operation of the programmable multi-mode DAC system, in accordance with certain aspects of the present disclosure.
Figure 8:
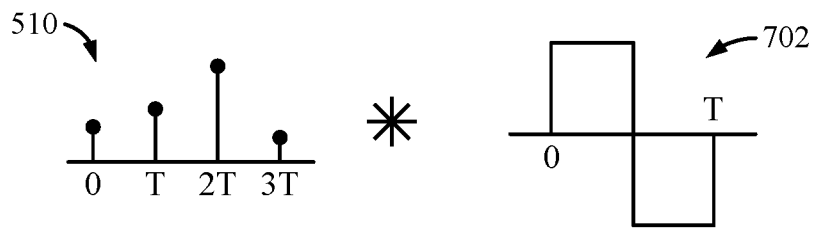
Figure 8:
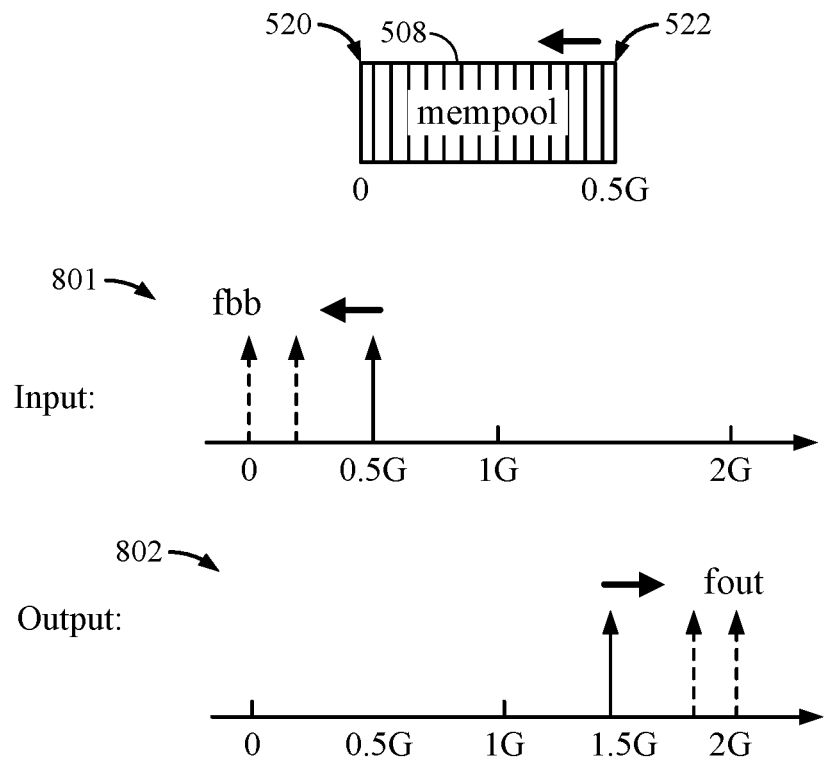

FIG. 8 illustrates the fourth mode of operation of the programmable multi-mode DAC system 500, in accordance with certain aspects of the present disclosure. In the fourth mode of operation, the mixer 504 coupled to the input of the DAC 502 is deactivated (e.g., bypassed), and the mixer 506 coupled to the output of the DAC 502 is activated (or remains activated). In this case, the data stored in the memory pool 508 is read and provided to the input of the mixer 504 starting from the second memory location 522 to the first memory location 520, such that the digital input represents a frequency sweep from fs/4 down to 0 (e.g., 0.5 GHz to 0 Hz) as illustrated by graph 801.

In this case, the digital signal represented by graph 510 is converted to an analog signal generated at the output of the mixer 506 based on the combined impulse response of the DAC 502 and the mixer 506 as illustrated in graph 702. In this manner, the frequency of the analog output signal (fout) may be represented by the following equation:

fout=fs-fbb

Thus, with a sampling frequency (fs) of 2 GHz, the frequency of the analog output signal (fout) sweeps from 1.5 GHz (3 fs/4) to 2 GHz (fs), as illustrated by graph 802. Therefore, by progressing through the first through fourth modes of operation using different combinations of the mixers 504, 506, the multi-mode DAC system 500 is capable of generating an analog output signal swept from 0 to the sampling frequency (fs) of the DAC 502, despite the Nyquist frequency limit (fs/2) for the DAC alone.

Figure 9:
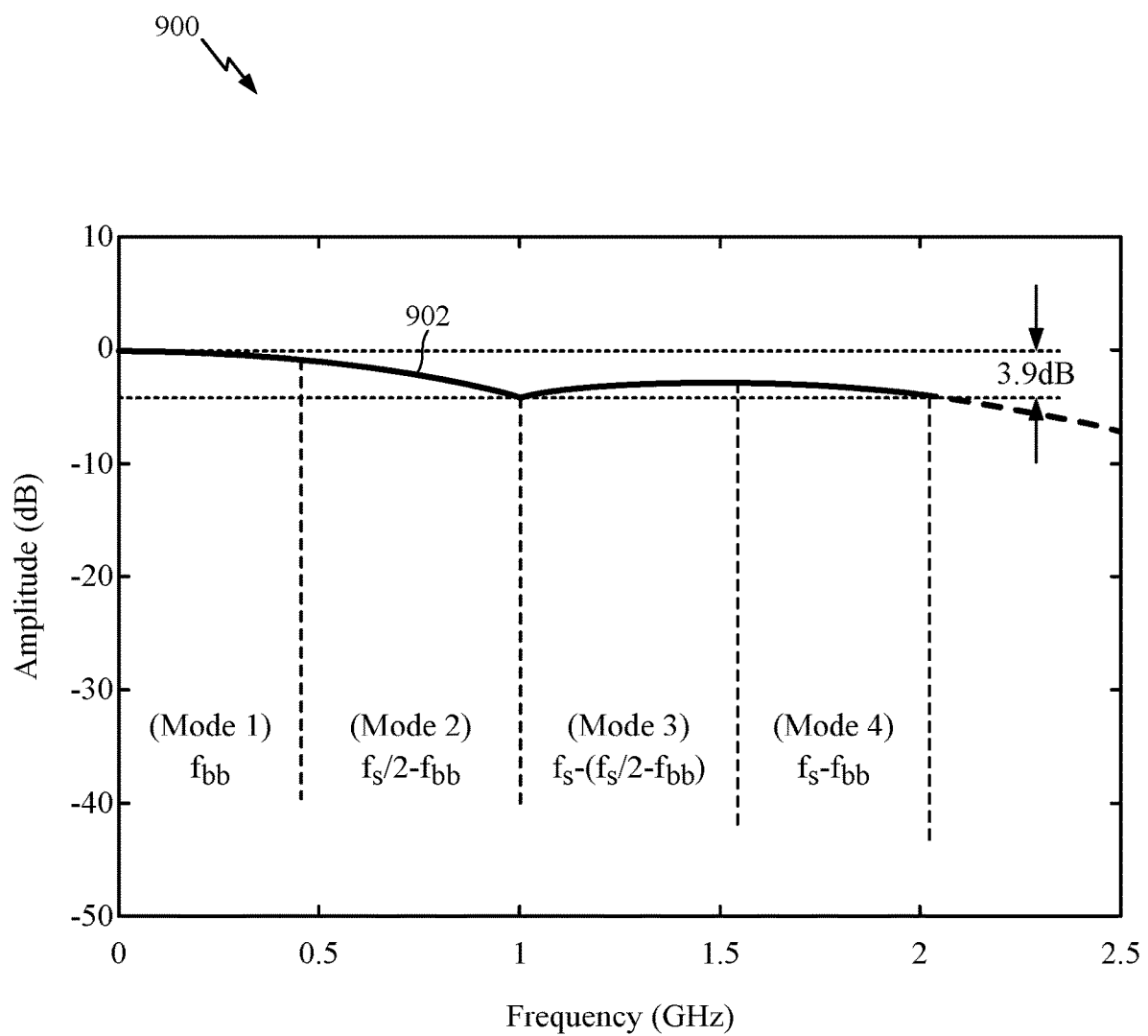
FIG. 9 is a graph illustrating an example frequency response of an analog output signal generated by a multi-mode DAC system, in accordance with certain aspects of the present disclosure.

FIG. 9 is a graph 900 illustrating the frequency response 902 of the analog output signal (fout) generated by the multi-mode DAC system 500, in accordance with certain aspects of the present disclosure. As illustrated, the analog output signal is swept from 0 Hz to 0.5 GHz in the first mode of operation as described with respect to FIG. 5, is swept from 0.5 GHz to 1 GHz in the second mode of operation as described with respect to FIG. 6, is swept from 1 GHz to 1.5 GHz in the third mode of operation as described with respect to FIG. 7, and is swept from 1.5 GHz to 2 GHz in the fourth mode of operation as described with respect to FIG. 8.

As illustrated, the amplitude of the analog output signal is lower (e.g., by about 3.9 dB) for frequencies in the second, third, and fourth modes of operation of the multi-mode DAC system 500 as compared to those in the first mode of operation. Certain aspects of the present disclosure provide techniques for compensating for, or at least reducing, this amplitude difference by implementing a gain in the digital or analog domain. For example, an amplification circuit may be used to apply a gain to the analog signal when the multi-mode DAC system 500 is operating in the second, third, and fourth modes. In certain aspects, a digital filter may be implemented to reduce the amplitude of the digital input in the first mode, or increase the amplitude of the digital input in the second, third, and fourth modes.

Figure 10:
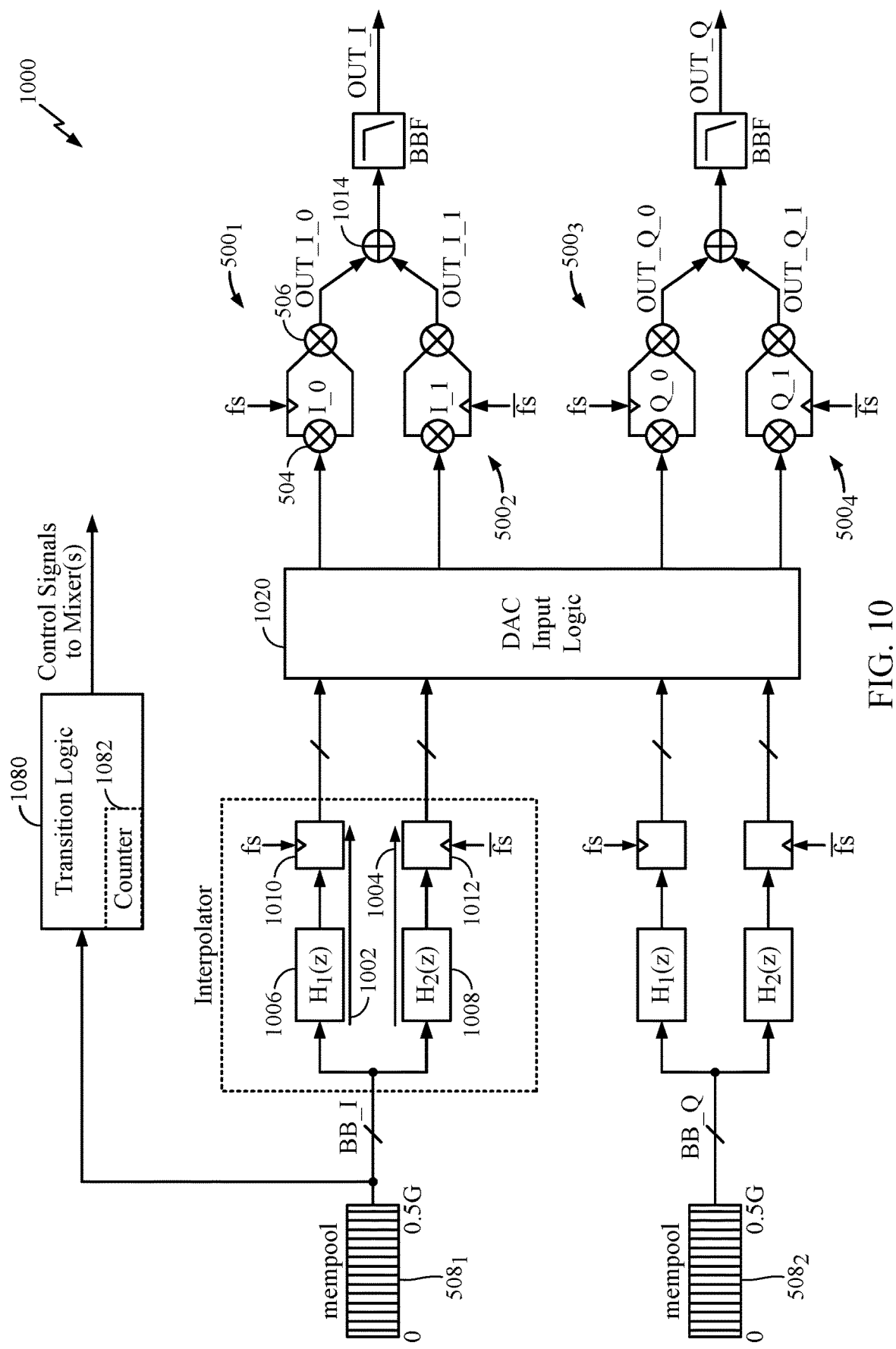
FIG. 10 illustrates an interleaved multi-mode DAC system, in accordance with certain aspects of the present disclosure.

FIG. 10 illustrates an interleaved DAC system 1000, in accordance with certain aspects of the present disclosure. As illustrated, digital baseband inputs (BB_I and BB_Q) may be generated from the memory pools $508_1$ and $508_2$ for in-phase (I) and quadrature (Q) paths, respectively. Each of the I and Q paths may include two parallel paths, each having one of the multi-mode DAC systems $500_1$, $500_2$, $500_3$, and $500_4$ (collectively referred to as multi-mode DAC systems 500), as described herein. For example, the parallel paths 1002 and 1004 of the 1 path may include filter circuits 1006 and 1008 (e.g., digital low-pass filters) and synchronization circuits 1010 and 1012. The synchronization circuit 1010 synchronizes the digital input of the path 1002 with a first clock signal having a frequency equal to the sampling frequency fs, and the synchronization circuit 1012 synchronizes the digital input of the path 1004 with a second clock signal, wherein the second clock signal is an inverse of the first clock signal. In other words, the path 1004 provides a digital signal to the multi-mode DAC system $500_2$ that is a delayed version of the digital signal provided by the path 1002 to the multi-mode DAC system $500_1$. As illustrated, the digital signals of paths 1002 and 1004 are provided to the multi-mode DAC systems $500_1$ and $500_2$ through DAC input logic 1020. The DAC input logic 1020 routes signals to the multi-mode DAC systems 500. The outputs of the multi-mode DAC systems $500_1$ and $500_2$ are summed by a summer circuit 1014 in order to attenuate image signals generated at the outputs of the multi-mode DAC systems $500_1$ and $500_2$.

In certain aspects, the interleaved DAC system 1000 may include transition logic 1080. The transition logic 1080 may determine when to transition between modes of the programmable multi-mode DAC system 500 and control (e.g., bypass or deactivate) mixers 504 and 506 accordingly. In certain aspects, the time to transition between modes of operation may be determined based on a bit of data stored in the memory pool (e.g., memory pool $508_1$). For example, the least significant bit of the memory location 522, as described with respect to FIG. 5, may indicate to transition from the first mode to the second mode of operation. Thus, the transition logic 1080 may activate the mixer 504 to transition from the first mode of operation as described with respect to FIG. 5 to the second mode of operation as described with respect to FIG. 6.

In certain aspects, the transition logic 1080 may additionally or alternatively include a counter 1082 for determining when to transition between modes of the programmable multi-mode DAC system 500. For example, the counter 1082 may be used to count a number of sampling periods of the DAC (e.g., DAC 502). The transition logic 1080 may transition the multi-mode DAC system 500 to a following mode of operation (e.g., second mode of operation as described with respect to FIG. 6) when the number of sampling periods counted reaches a total number of sampling periods for the DAC during the current mode of operation (e.g., first mode of operation as described with respect to FIG. 5). For example, the total number of sampling periods may correspond to (e.g., be a fraction of) the number of digital values stored in the memory pool (e.g., the memory pool 508).

Figure 11:
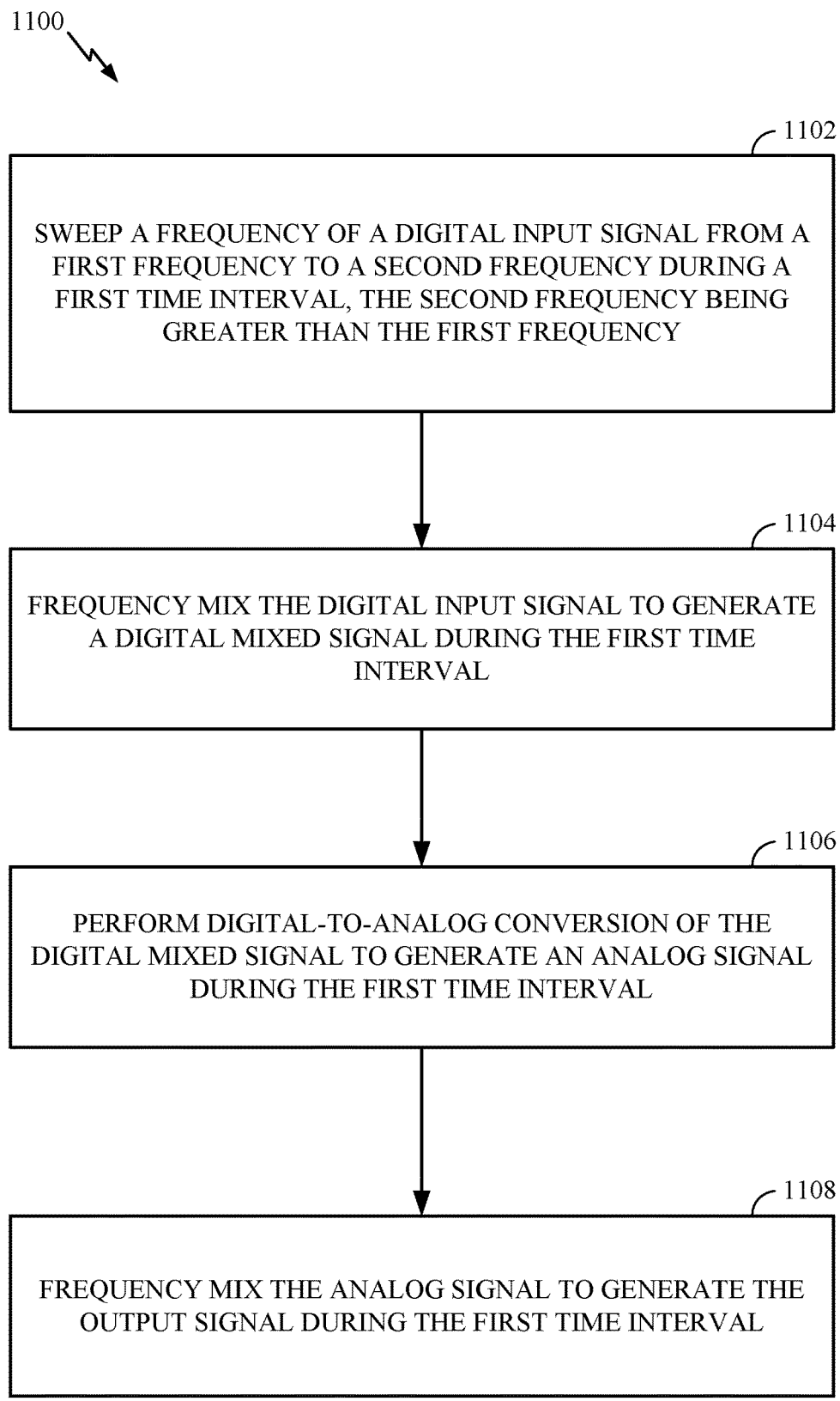
FIG. 11 is a flow diagram illustrating example operations for sweeping a frequency of an output signal, in accordance with certain aspects of the present disclosure.

FIG. 11 is a flow diagram illustrating example operations 1100 for sweeping a frequency of an output signal, in accordance with certain aspects of the present disclosure. The operations 1100 may be performed, for example, by a programmable multi-mode DAC system, such as the programmable multi-mode DAC system 500.

The operations 1100 describe the operation of the programmable multi-mode DAC system 500 during four time intervals corresponding to the different modes of operation described herein. For example, during the first time interval, the programmable multi-mode DAC system 500 may be configured in the third mode of operation as described with respect to FIG. 7, during the second time interval, the programmable multi-mode DAC system 500 may be configured in the fourth mode of operation described with respect to FIG. 8, during the third time interval, the programmable multi-mode DAC system 500 may be configured in the second mode of operation described with respect to FIG. 6, and during the fourth time interval, the programmable multi-mode DAC system 500 may be configured in the first mode of operation described with respect to FIG. 5.

The operations 1100 begin, at block 1102, by sweeping a frequency of a digital input signal from a first frequency (e.g., 0 Hz) to a second frequency (e.g., 0.5 GHz) during a first time interval, the second frequency being greater than the first frequency, and at block 1104, by frequency mixing (e.g., via the mixer 504) the digital input signal to generate a digital mixed signal during the first time interval (e.g., while operating in the third mode of operation as described with respect to FIG. 7). At block 1106, the operations 1100 continue by performing digital-to-analog conversion (e.g., via the DAC 502) of the digital mixed signal to generate an analog signal during the first time interval, and at block 1108, frequency mixing (e.g., via the mixer 506) the analog signal to generate the output signal during the first time interval.

In certain aspects, performing the digital-to-analog conversion comprises processing the digital mixed signal with a digital-to-analog converter using a clock signal having a sampling frequency (e.g., sampling frequency fs). The frequency of the output signal may be swept from the sampling frequency to three/fourths the sampling frequency. In certain aspects, sweeping the frequency of the digital input signal includes reading digital data stored in a memory (e.g., memory pool 508), and generating the digital input signal based on the digital data stored in the memory.

In certain aspects, the operations 1100 may also include sweeping the frequency of the digital input signal from the second frequency (e.g., 0.5 GHz) to the first frequency (e.g., 0 Hz) during a second time interval (e.g., while operating in the fourth mode of operation as described with respect to FIG. 8), the second time interval being after the first time interval. In this case, the operations 1100 also include performing digital-to-analog conversion (e.g., via the DAC 502) of the digital input signal to generate the analog signal during the second time interval, and frequency mixing (e.g., via the mixer 506) the analog signal to generate the output signal during the second time interval.

In certain aspects, the frequency mixing the digital input signal, performed at block 1104, includes processing the digital input signal in a mixer (e.g., mixer 504) to generate the digital mixed signal. In this case, the operations 1100 also include bypassing or disabling the mixer (e.g., mixer 504) before the second time interval.

In certain aspects, the sweeping of the frequency of the digital input signal from the first frequency to the second frequency comprises reading digital data stored in a memory (e.g., memory pool 508) starting from a first memory location (e.g., memory location 520) to a second memory location (e.g., memory location 522). In this case, the sweeping of the frequency of the digital input signal from the second frequency to the first frequency comprises reading the digital data stored in the memory starting from the second memory location to the first memory location.

In certain aspects, the operations 1100 also include transitioning from the first time interval to the second time interval based on a value of a bit of data stored in the second memory location. In some cases, the bit may be a least significant bit of data stored in the second memory location.

In certain aspects, the operations 1100 also include counting (e.g., via counter 1082) a number of sampling periods of the digital-to-analog conversion, and transitioning from the first time interval to the second time interval when the number of sampling periods counted reaches a total number of sampling periods for the digital-to-analog conversion during the first time interval, the total number being based on the digital data stored in the memory.

In certain aspects, the operations 1100 also include sweeping the frequency of the digital input signal from the second frequency to the first frequency during a third time interval (e.g., while operating in the second mode of operation as described with respect to FIG. 6), the third time interval being before the first time interval, frequency mixing the digital input signal to generate the digital mixed signal during the third time interval, and performing digital-to-analog conversion of the digital mixed signal to generate the output signal during the third time interval.

In certain aspects, the frequency mixing the analog signal includes processing the analog signal in a mixer (e.g., mixer 506) to generate the output signal. In this case, the operations 1100 also include bypassing or disabling the mixer before the third time interval.

In certain aspects, the operations 1100 also include sweeping the frequency of the digital input signal from the first frequency to the second frequency during a fourth time interval (e.g., while operating in the first mode of operation as described with respect to FIG. 5), the fourth time interval being before the third time interval, and performing digital-to-analog conversion of the digital input signal to generate the output signal during the fourth time interval.

In certain aspects, the frequency mixing the digital input signal at block 1104 comprises processing the digital input signal in a first mixer (e.g., mixer 504) to generate the digital mixed signal, and the frequency mixing the analog signal at block 1108 comprises processing the analog signal in a second mixer (e.g., mixer 506) to generate the output signal. In this case, the operations 1100 include bypassing or disabling the first mixer and the second mixer before the fourth time interval.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for sweeping a frequency of a digital input signal may comprise, for example, a memory pool such as the memory pool 508 and/or a controller such as the controller 230. Means for selectively frequency mixing a digital input signal may comprise, for example, a mixing circuit such as the mixer 504, which may be in parallel with a means for bypassing the mixing circuit (e.g., a switch). Means for converting may comprise, for example, a DAC such as the DAC 502. Means for selectively frequency mixing an analog signal may comprise, for example, a mixing circuit such as the mixer 506, which may be in parallel with a means for bypassing the mixing circuit (e.g., a switch).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for sweeping a frequency of an output signal, comprising:
    a digital-to-analog converter (DAC) having an input coupled to an input path of the circuit and an output coupled to an output path of the circuit;
    a first mixer selectively incorporated in the input path coupled to the input of the DAC; and
    a second mixer selectively incorporated in the output path coupled to the output of the DAC.

2. The circuit of claim 1, wherein the DAC is configured to operate using a clock signal having a sampling frequency and wherein the frequency of the output signal is swept from zero to the sampling frequency.

3. The circuit of claim 1, wherein, when the circuit is configured in a first mode of operation, the circuit is configured to:
    sweep a frequency of a digital input signal from a first frequency to a second frequency, the second frequency being greater than the first frequency; and
    provide the digital input signal to the input of the DAC via the input path, the output signal being generated at the output of the DAC.

4. The circuit of claim 3, wherein the first mixer and the second mixer are configured to be disabled or bypassed while the circuit is configured in the first mode of operation.

5. The circuit of claim 3, further comprising:
    a processing system; and a memory coupled to the processing system, wherein the processing system is configured to sweep the frequency of the digital input signal from the first frequency to the second frequency by reading digital data stored in the memory and generating the digital input signal based on the digital data stored in the memory.

6. The circuit of claim 3, wherein, when the circuit is configured in a second mode of operation after the first mode of operation, the circuit is configured to:
sweep the frequency of the digital input signal from the second frequency to the first frequency; and
provide the digital input signal to an input of the first mixer, an output of the first mixer being coupled to the input of the DAC, and the output signal being generated at the output of the DAC.

7. The circuit of claim 6, wherein the second mixer is configured to be disabled or bypassed while the circuit is configured in the second mode of operation.

8. The circuit of claim 6, further comprising:
a processing system; and
a memory coupled to the processing system, wherein the processing system is configured to:
sweep the frequency of the digital input signal from the first frequency to the second frequency by reading digital data stored in the memory in order starting from a first memory location and ending at a second memory location; and
sweep the frequency of the digital input signal from the second frequency to the first frequency by reading digital data stored in the memory in order starting from the second memory location and ending at the first memory location.

9. The circuit of claim 8, wherein the circuit is configured to transition from the first mode of operation to the second mode of operation based on a value of a bit of data stored in the second memory location.

10. The circuit of claim 9, wherein the bit comprises a least significant bit of data stored in the second memory location.

11. The circuit of claim 8, further comprising a counter, wherein the circuit is configured to transition from the first mode of operation to the second mode of operation when a number of sampling periods of the DAC counted by the counter reaches a total number of sampling periods for the DAC during the first mode of operation, the total number being based on the digital data stored in the memory.

12. The circuit of claim 6, wherein, when the circuit is configured in a third mode of operation after the second mode of operation, the circuit is configured to:
sweep the frequency of the digital input signal from the first frequency to the second frequency;
provide the digital input signal to the input of the first mixer, the output of the first mixer being coupled to the input of the DAC; and
process the output of the DAC using the second mixer, the output signal being generated at an output of the second mixer.

13. The circuit of claim 12, wherein, when the circuit is configured in a fourth mode of operation after the third mode of operation, the circuit is configured to:
sweep the frequency of the digital input signal from the second frequency to the first frequency;
provide the digital input signal to the input of the DAC; and
process the output of the DAC using the second mixer, the output signal being generated at the output of the second mixer.

14. The circuit of claim 13, wherein the first mixer is configured to be disabled or bypassed while the circuit is configured in the fourth mode of operation.

15. The circuit of claim 13, further comprising an amplification circuit configured to increase an amplitude of the output signal generated while the circuit is configured in at least one of the second, third, or fourth modes of operation.

16. The circuit of claim 1, further comprising:
another digital-to-analog converter (DAC) having an input coupled to another input path and an output coupled to another output path;
a third mixer selectively incorporated in the other input path coupled to the input of the other DAC;
a fourth mixer selectively incorporated in the other output path coupled to the output of the other DAC; and
a summer circuit having inputs coupled to the output path and the other output path.

17. The circuit of claim 16, wherein:
the input path comprises a filter configured to generate a filtered signal based on a digital input signal, and a synchronization circuit configured to synchronize the filtered signal to a clock signal; and
the other input path comprises another filter configured to generate another filtered signal based on the digital input signal, and another synchronization circuit configured to synchronize the other filtered signal to another clock signal, the other clock signal being an inverse of the clock signal.

18. A method for sweeping a frequency of an output signal, comprising:
sweeping a frequency of a digital input signal from a first frequency to a second frequency during a first time interval, the second frequency being greater than the first frequency;
frequency mixing the digital input signal to generate a digital mixed signal during the first time interval;
performing digital-to-analog conversion of the digital mixed signal to generate an analog signal during the first time interval; and
frequency mixing the analog signal to generate the output signal during the first time interval.

19. The method of claim 18, wherein performing the digital-to-analog conversion comprises processing the digital mixed signal with a digital-to-analog converter using a clock signal having a sampling frequency and wherein the frequency of the output signal is swept from the sampling frequency to three/fourths the sampling frequency.

20. The method of claim 18, wherein sweeping the frequency of the digital input signal comprises:
reading digital data stored in a memory; and
generating the digital input signal based on the digital data stored in the memory.

21. The method of claim 18, further comprising:
sweeping the frequency of the digital input signal from the second frequency to the first frequency during a second time interval, the second time interval being after the first time interval;
performing digital-to-analog conversion of the digital input signal to generate the analog signal during the second time interval; and
frequency mixing the analog signal to generate the output signal during the second time interval.

22. The method of claim 21, wherein the frequency mixing the digital input signal comprises processing the digital input signal in a mixer to generate the digital mixed signal, the method further comprising bypassing or disabling the mixer before the second time interval.

23. The method of claim 21, wherein:
the sweeping of the frequency of the digital input signal from the first frequency to the second frequency comprises reading digital data stored in a memory starting from a first memory location to a second memory location; and
the sweeping of the frequency of the digital input signal from the second frequency to the first frequency comprises reading the digital data stored in the memory starting from the second memory location to the first memory location.

24. The method of claim 23, further comprising transitioning from the first time interval to the second time interval based on a value of a bit of data stored in the second memory location.

25. The method of claim 24, wherein the bit comprises a least significant bit of data stored in the second memory location.

26. The method of claim 23, further comprising:
counting a number of sampling periods of the digital-to-analog conversion; and
transitioning from the first time interval to the second time interval when the number of sampling periods counted reaches a total number of sampling periods for the digital-to-analog conversion during the first time interval, the total number being based on the digital data stored in the memory.

27. The method of claim 21, further comprising:
sweeping the frequency of the digital input signal from the second frequency to the first frequency during a third time interval, the third time interval being before the first time interval;
frequency mixing the digital input signal to generate the digital mixed signal during the third time interval; and
performing digital-to-analog conversion of the digital mixed signal to generate the output signal during the third time interval.

28. The method of claim 27, wherein the frequency mixing the analog signal comprises processing the analog signal in a mixer to generate the output signal, the method further comprising bypassing or disabling the mixer before the third time interval.

29. The method of claim 27, further comprising:
sweeping the frequency of the digital input signal from the first frequency to the second frequency during a fourth time interval, the fourth time interval being before the third time interval; and
performing digital-to-analog conversion of the digital input signal to generate the output signal during the fourth time interval.

30. An apparatus for sweeping a frequency of an output signal, comprising:
means for sweeping a frequency of a digital input signal from a first frequency to a second frequency, the second frequency being greater than the first frequency;
means for selectively frequency mixing the digital input signal to generate a digital mixed signal;
means for converting the digital mixed signal to an analog signal; and
means for selectively frequency mixing the analog signal to generate the output signal.

* * * * *